(12) United States Patent
Schönfeld et al.

(10) Patent No.: US 6,177,352 B1
(45) Date of Patent: Jan. 23, 2001

(54) METHOD FOR PRODUCING SEMICONDUCTOR BODIES WITH AN MOVPE LAYER SEQUENCE

(75) Inventors: Olaf Schönfeld, Regensburg; Ernst Nirschl, Wenzenbach, both of (DE)

(73) Assignee: Siemens Aktiengesellschaft, Munich (DE)

(*) Notice: Under 35 U.S.C. 154(b), the term of this patent shall be extended for 0 days.

(21) Appl. No.: 09/250,868

(22) Filed: Feb. 16, 1999

Related U.S. Application Data

(63) Continuation of application No. PCT/DE97/01738, filed on Aug. 13, 1997.

(30) Foreign Application Priority Data

Aug. 13, 1996 (DE) .............................................. 196 32 626

(51) Int. Cl.[7] .................................................. H01L 21/316
(52) U.S. Cl. ......................... 438/701; 438/700; 438/734; 438/737
(58) Field of Search .................................. 438/701, 737, 438/700, 734

(56) References Cited

U.S. PATENT DOCUMENTS

| | | |
|---|---|---|
| 4,354,898 | 10/1982 | Coldren et al. . |
| 4,393,574 * | 7/1983 | Shimbo .................................. 29/571 |
| 4,984,035 * | 1/1991 | Kanzawa et al. ...................... 357/17 |
| 5,233,204 | 8/1993 | Fletcher et al. . |
| 5,289,038 * | 2/1994 | Amano ................................. 257/780 |
| 5,309,001 | 5/1994 | Watanabe et al. . |

OTHER PUBLICATIONS

"Reactive ion etching of GaAs, AlGaAs, and GaSb in $Cl_2$ and $SiCl_4$", S.J. Pearton et al., 8257b Journal of Vacuum Science & Technology, Jul./Aug. 1990, No. 4, pp. 607–617.*

"Modeling of sloped sidewalls formed by simultaneous etching and deposition", M. Gross et al., 8257b Journal of Vacuum Science & Technology, May/Jun. 1989, No. 3, pp. 534–541.*

* cited by examiner

Primary Examiner—Robert Kunemund
(74) Attorney, Agent, or Firm—Herbert L. Lerner; Laurence A. Greenberg; Werner H. Stemer

(57) ABSTRACT

A method for producing at least one semiconductor body by metal organic vapor phase epitaxy (MOVPE). The semiconductor body is formed of a layer sequence with an active zone applied to a semiconductor wafer. By dry etching, the layer sequence is provided with at least one mesa trench whose depth is at least great enough that the active zone of the layer sequence is severed. Next, the composite including the semiconductor wafer and the layer sequence is severed in such a way that the at least one semiconductor body is created with at least one mesa edge.

15 Claims, 2 Drawing Sheets

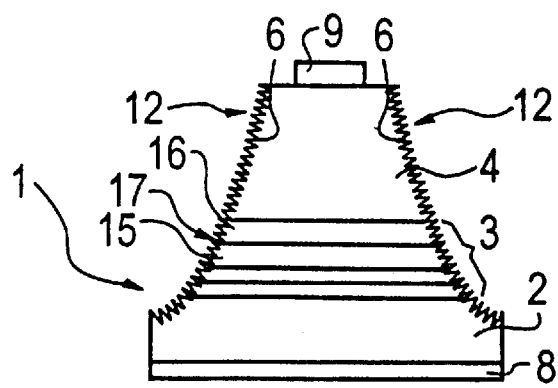
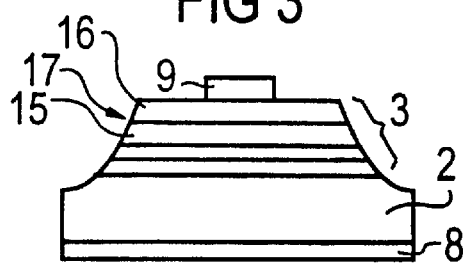
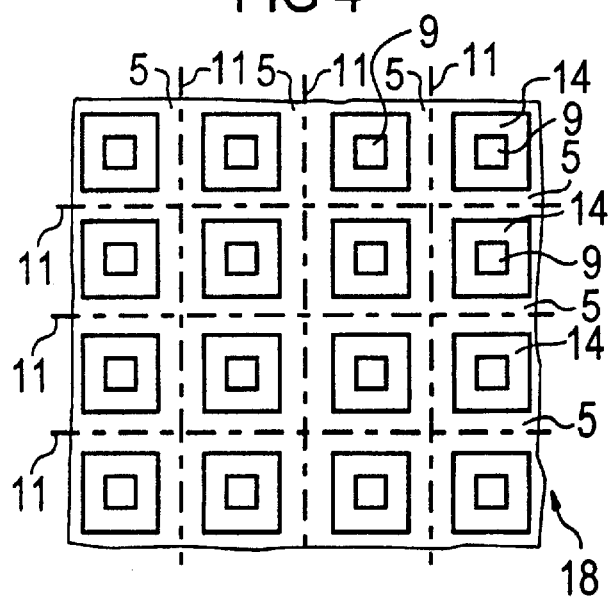

METHOD FOR PRODUCING SEMICONDUCTOR BODIES WITH AN MOVPE LAYER SEQUENCE

CROSS-REFERENCE TO RELATED APPLICATION

This is a continuation of copending International Application PCT/DE97/01738, filed Aug. 13, 1997, which designated the United States.

BACKGROUND OF THE INVENTION

Field of the Invention

The invention relates to a method for producing at least one semiconductor body. The semiconductor body is formed of a layer sequence with at least one active zone that is applied to a semiconductor wafer by metal organic vapor phase epitaxy, and in which the layer sequence is provided with at least one mesa trench. It relates in particular to a method for producing light emitting diode (LED) chips with a mesa structure by metal organic vapor phase epitaxy (MOVPE).

A method for producing MOVPE LED chips is known for instance from U.S. Pat. No. 5,233,204. In it, by metal organic vapor phase epitaxy (MOVPE), a heterostructure including an n-conductive first InGaAlP boundary layer, an n-conductive active InGaAlP layer, and a p-conductive second InGaAlP boundary layer are deposited on a GaAs semiconductor wafer. A window layer of AlGaAs, GaAsP or GaP is applied by epitaxy to the second InGaAlP boundary layer. Next, an underside contact metallizing is applied to the underside of the semiconductor wafer, and a plurality of top contact metallizings are applied to the top side of the window layer. The semiconductor wafer is subsequently divided up into individual LED chips by sawing or diamond-wheel dicing.

In the LED chips, the window layer serves first to attain a lateral current propagation as much as possible over the entire cross section of the p-n junction, and second to increase the surface area of the LED chips that is available for light output. The ratio between the area of the semiconductor body covered by the top contact to the free surface area of the semiconductor body is increased. However, a large proportion of the radiation generated in the active zone is still lost by the total reflection at the surface of the LED chip.

Furthermore, when the semiconductor wafer is sawed or diced, destruction to the side faces of the epitaxial layers occurs, which among other things causes faster aging (degradation in the brightness of the LED over time) of the LED chips.

From Published, Non-Prosecuted German Patent Application DE 43 05 296 A1, corresponding to U.S. Pat. No. 5,429,954, a method for producing an LED is known in which mesa trenches are formed by wet-chemical etching in a layer sequence applied epitaxially to a substrate body, in order to improve the radiation power.

Such a wet-chemical etching process, however, in LED chips made by MOVPE, leads to selective etching of the MOVPE layer sequence. This creates so-called "mushroom" structures, which in semiconductor chips are provided with plastic sheathing because of mechanical stress, again causing faster aging (degradation in the electrical properties over time).

In U.S. Pat. No. 5,309,001, an MOVPE LED chip with a mesa structure is described that is made by wet-chemical etching or by reactive ion beam etching. The external quantum efficiency of such diodes, however, is still very low.

SUMMARY OF THE INVENTION

It is accordingly an object of the invention to provide a method for producing semiconductor bodies with an MOVPE layer sequence that overcomes the above-mentioned disadvantages of the prior art methods of this general type, which exhibit reducing aging and with which MOVPE LED chips can be produced with improved output of the radiation, generated in the active layer, from the semiconductor body.

With the foregoing and other objects in view there is provided, in accordance with the invention, a method for producing at least one semiconductor body, which includes: providing a semiconductor wafer; applying a layer sequence with at least one active zone to the semiconductor wafer by a metal organic vapor phase epitaxy; and dry etching at least one mesa trench in the layer sequence, and varying etching parameters during the dry etching such that with an increasing etching depth a ratio of a vertical etching rate to a horizontal etching rate is increased for creating at least one semiconductor body with at least one side face curved in a concave fashion.

According to the invention, it is provided that on the semiconductor wafer, by a metal organic vapor phase epitaxy (MOVPE), a layer sequence with at least one active zone is applied. The active zone is formed, into a light emitting diode (LED) or photo diode chip, for instance, in such a way that it transmits light when it is acted upon by an electric current and/or that it generates an electric voltage if it receives light. The layer sequence is provided with at least one mesa trench by dry etching, and during the dry etching the etching parameters are varied in such a way that with increasing etching depth the ratio of the vertical etching rate to the horizontal etching rate is increased. In this manner, the semiconductor body with the at least one side face is curved in a concave fashion as viewed from outside the semiconductor body.

During the dry etching, to increase the ratio of the vertical etching rate to the horizontal etching rate, the concentration of the various gases in an etching gas mixture is preferably varied.

For etching the mesa trench in the semiconductor body, which is formed substantially from GaAs, GaP or GaN or at least one alloy of these materials with Al and/or In, an etching gas mixture is preferably used that has at least chlorine and silicon tetrachloride or at least chlorine and boron trichloride; and that the chlorine concentration in the etching gas mixture is varied during the etching. In comparison with conventional etching gas mixtures, which contain only a single one of the gases in the group including silicon tetrachloride, boron trichloride and chlorine, a markedly increased etching rate is attained by adding chlorine and at least one of the components in the group including silicon tetrachloride and boron trichloride. By varying the chlorine concentration in the etching gas mixture, an in-situ variation of the etching rate and thus the establishment of arbitrary etching angles are possible. If the chlorine concentration in the etching gas mixture is reduced with increasing etching depth in according to the invention, the result is a mesa trench with a concavely curved inner surface.

The mesa trench is preferably etched into the MOVPE layer sequence such that the active zone is severed. After that, the composite is divided up into individual semiconductor bodies, each with at least one mesa edge.

In the dry etching, no selective etching of the MOVPE layer sequence takes place. Hence no "mushroom" structures, which would cause increased mechanical stress and consequently faster aging of the semiconductor body, are created. Furthermore, in a semiconductor body produced by the method of the invention, the side faces of the active zone, such as a light-emitting and/or light-receiving p-n junction, advantageously exhibit markedly less destruction than is the case with semiconductor bodies made by sawing or dicing.

Another advantage of the method of the invention is that in the case of light-emitting semiconductor bodies, because of the curvature of the side faces (mesa curvature) of the semiconductor body, as compared with conventionally made semiconductor bodies with flat side faces, a greater proportion of the light generated in the active zone falls onto the boundary between the semiconductor body and the ambient medium (such as air or plastic) at an angle that is less than the limit angle of the total reflection. Less light is therefore reflected back into the semiconductor body, and the optical efficiency is increased.

It is also especially advantageous that by the method of the invention, the mesa etching creates regions of the active zone that are already separated from one another, and which are joined to one another mechanically by the semiconductor wafer that has not been etched all the way through. It is thus possible to measure the function of active zones, separate from one another, in the wafer composite, and only after that to divide up the semiconductor wafer finally into separate semiconductor bodies, for instance by means of sawing.

Thus by way of example and advantageously, 100% of the p-n junctions that have been etched through in the wafer composite can be measured with wafer testers.

In a preferred embodiment of the method of the invention, the semiconductor wafer substantially includes GaAs.

Especially advantageously, the method of the invention can be employed in semiconductor bodies that have a layer sequence with one or more semiconductor layers including InGaAlP. Such semiconductor layers in fact, after conventional severing of the composite by sawing, have major destruction at their side edges.

In a preferred embodiment, the layer sequence has an n-conductive first InGaAlP boundary layer, then an n-conductive active InGaAlP layer, and an n-conductive second InGaAlP boundary layer.

In a preferred application of the method of the invention to make light-emitting and/or light receiving semiconductor bodies, a window layer for instance formed of semiconductor material is advantageously made on the layer sequence. The window layer is permeable to the light transmitted and/or received from the active zone.

In an especially preferred refinement of this embodiment, the window layer is made from a material that has a higher electrical conductivity than the layer sequence.

The thickness of the window layer can advantageously be reduced markedly in comparison with the known window layer described at the outset, and can range for instance between 10 and 60 $\mu$m. Because of the mesa curvature of the side faces of the semiconductor body made by the method of the instant application, a greater proportion of the light generated in the active zone in fact falls onto the boundary between the semiconductor body and the ambient medium (such as air or plastic) at an angle that is smaller than the limit angle of the total reflection.

In a preferred embodiment of the method of the invention, a window layer of GaP or AlGaAs is applied to the layer sequence.

In another further preferred embodiment of the method of the invention, a roughened surface of the side faces of the semiconductor bodies is created in the dry etching. For light-emitting semiconductor bodies, this advantageously improves the light output, because once again this increases the proportion of radiation emitted from the active zone that falls onto the boundary between the semiconductor body and the ambient medium at an angle that is smaller than the limit angle of the total reflection.

In an especially preferred refinement of the method of the invention, the disposition of mesa trenches is selected such that all the side faces of the semiconductor bodies have a mesa curvature.

Furthermore, in semiconductor bodies provided with a plastic sheath, the roughened surface achieves improved adhesion between the plastic sheath and the semiconductor body. This reduces the risk of delamination between the semiconductor body and the plastic sheath.

With the method of the invention, light-emitting and/or light-receiving semiconductor bodies whose optical efficiency is approximately 70% can advantageously be produced.

It is also conceivable to employ the method of the invention not only in semiconductor wafers with an MOVPE layer sequence but also for semiconductor wafers made by any other deposition process (such as liquid phase epitaxy, CVD, MBE, and so forth).

In a layer sequence with an n-conductive first InGaAlP boundary layer, an n-conductive active InGaAlP layer, and an n-conductive second InGaAlP boundary layer, the etching gas mixture preferably contains $Cl_2$ and $BCl_3$, or $Cl_2$ and $SiCl_4$. To increase the ratio of the vertical etching rate or the horizontal etching rate, the concentration of $Cl_2$ in the etching gas mixture is varied during the etching of the mesa trench.

Other features which are considered as characteristic for the invention are set forth in the appended claims.

Although the invention is illustrated and described herein as embodied in a method for producing semiconductor bodies with an MOVPE layer sequence, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a sectional view of the semiconductor body made by a second exemplary embodiment of the method;

FIG. 3 is a sectional view of the semiconductor body made by a third exemplary embodiment of the method; and FIG. 4 is a plan view of a semiconductor wafer made by the method.

DESCRIPTION OF THE PREFERRED EMBODIMENTS

Figure 1A:
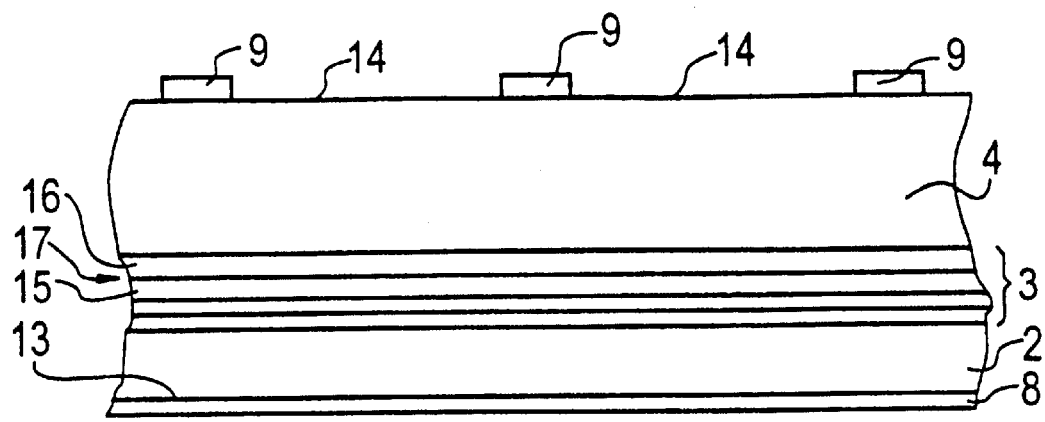
FIGS. 1a–1c are diagrammatic, sectional views of a sequence in a first exemplary embodiment of a method for producing a semiconductor body according to the invention.
Figure 1A:
Figure 1B:
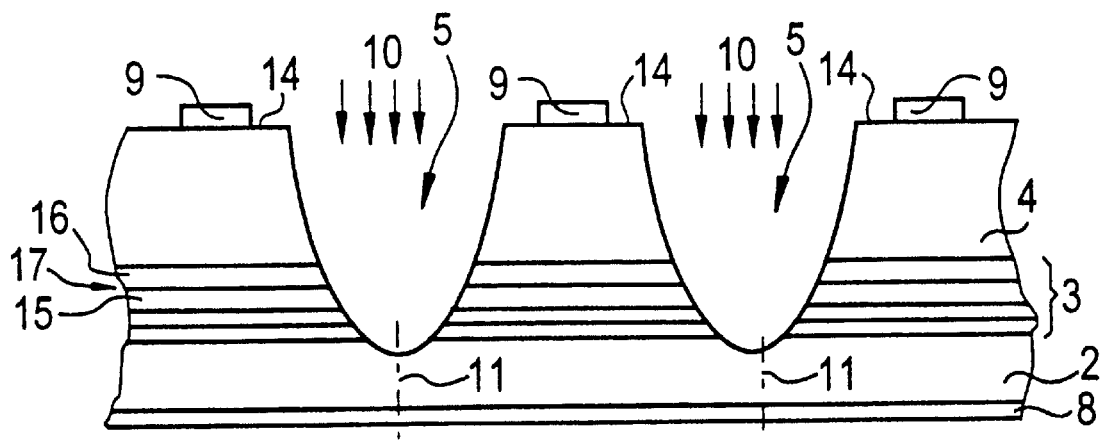
Figure 1B:
Figure 1C:
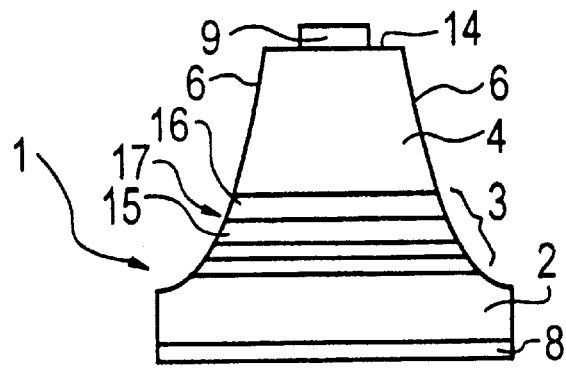

In all the figures of the drawing, sub-features and integral parts that correspond to one another bear the same reference symbol in each case. Referring now to the figures of the drawing in detail and first, particularly, to FIGS. 1a–1c thereof, there is shown a layer sequence 3 that is first applied to a semiconductor wafer 2, which for instance is formed of GaAs, by a metal organic vapor phase epitaxy (MOVPE). The layer sequence 3 for instance includes InGaAsP and has an active zone 17. The active zone 17 is for instance a p-n junction of a light-emitting diode (LED). The layer sequence 3 has for instance one n-conductive InGaAlP epitaxial layer 15 and one p-conductive InGaAlP epitaxial layer 16.

The active zone 17 is embodied such that it transmits light if it is acted upon by an electric current, and/or that it generates an electric voltage if it receives light. Active zones 17 of this kind and the associated production processes are familiar to one skilled in the art and will therefore not be described in further detail here.

Onto the layer sequence 3, for instance by a metal organic vapor phase epitaxy (MOVPE) or liquid phase epitaxy (LPE), a window layer 4 is then applied, which for instance includes GaP or AlGaAs. This semiconductor material has a greater band gap than InGaAlP and is therefore permeable to the light transmitted and/or received from the active zone 17.

After that, a first contact metallizing 8 is applied to an underside 13 of the semiconductor wafer 2, and a plurality of second contact metallizings 9 are applied to a top side 14 of the window layer 4. These metallizings for instance include conventional metal contact materials employed in semiconductor technology.

As the next step, optionally after a mesa mask for instance including metal, oxide, or organic resist has been applied to the top side 14 of the window layer 4 and the second contact metallizings 9, a plurality of mesa trenches 5 with curved mesa edges 6 is etched by dry etching (as represented by the arrows 10 in FIG. 1b) into the composite including the semiconductor wafer 2, the layer sequence 3, the window layer 4, and the first and second contact metallizings 8, 9.

During the dry etching 10, the etching parameters are varied in such a way that with increasing etching depth, the ratio of the vertical etching rate to the horizontal etching rate is increased. This creates the curved mesa edges 6. The depth of the mesa trenches 5 is selected such that the window layer 4 and the layer sequence 3 are severed completely, and the semiconductor wafer 2 is only etched partway.

By way of example, reactive ion etching (RIE), plasma etching, or some other dry etching method known to be suitable to one skilled in the art is employed as the dry etching process.

As the etching gas mixture for RIE, $CH_4/Ar/H_2/Cl_2/BCl_3$ or $CH_4/Ar/H_2/Cl_2/SiCl_4$ is for instance used. To increase the ratio of the vertical etching rate to the horizontal etching rate, the concentration of $Cl_2$ in the etching gas mixture is varied during the etching 10.

After that, the semiconductor wafer 2 and the first contact metallizing 8 in the mesa trenches 5 are divided up along the parting lines represented by dot-dashed lines 11, for instance by dicing, to form individual light-emitting and/or light-receiving semiconductor bodies 1 having the mesa edges 6.

The configuration of the mesa trenches 5 can for instance be selected such that the semiconductor bodies 1 have a mesa curvature on all four side faces, as shown in FIG. 4. To that end, the mesa trenches 5 are disposed in a square grid 18. After the mesa trenches 5 have been etched, the semiconductor wafer 2 is severed along the parting lines 11 and thus divided up into a plurality of the semiconductor bodies 1 with the mesa edges 6.

With the method described above, the semiconductor bodies 1 which have at least one concave side face or mesa edge 6, as seen from outside the semiconductor body 1, are produced.

The semiconductor body 1 of FIG. 2 differs from the semiconductor bodies 1 of FIG. 1 in that it has mesa edges 6 which have a roughened surface 12. The roughened surface 12 can be created for instance by a suitable adjustment of the dry etching parameters when the mesa trenches 5 are etched. The depth of the roughened surface 12 can range for instance between 50 and 300 $\mu$m. Except for this, there is no difference between the method for producing a plurality of such semiconductor bodies 1 and the method described in conjunction with FIG. 1.

Furthermore, the method described above can naturally also be employed to produce semiconductor bodies 1 that have no window layer 4. In the semiconductor bodies 1 of that kind, the second contact metallizings 9 are then for instance applied directly to the layer sequence 3, as shown in FIG. 3. The rest of the method proceeds analogously to the methods described above.

We claim:

1. A method for producing at least one semiconductor body, which comprises:

providing a semiconductor wafer;

applying a layer sequence with at least one active zone to the semiconductor wafer by a metal organic vapor phase epitaxy; and dry etching at least one mesa trench in the layer sequence, and varying etching parameters during the dry etching such that with an increasing etching depth a ratio of a vertical etching rate to a horizontal etching rate is increased for creating at least one semiconductor body with at least one side face curved in a concave fashion as viewed from outside the at least one semiconductor body.

2. The method according to claim 1, which comprises varying a concentration of various gases of an etching gas mixture during the dry etching step to increase the ratio of the vertical etching rate to the horizontal etching rate.

3. The method according to claim 1, which comprises:

forming the at least one semiconductor body substantially from a material selected from the group consisting of GaAs, GaP, GaN, and an alloy of one of GaAs, GaP, and GaN formed with at least one of Al and In;

using an etching gas mixture selected from the group consisting of chlorine and silicon tetrachloride, and chlorine and boron trichloride during the dry etching step; and varying a concentration of the chlorine in the etching gas mixture during the dry etching step.

4. The method according to claim 1, which comprises:

severing the at least one active zone of the layer sequence during the dry etching step; and severing subsequently a composite formed of the semiconductor wafer and the layer sequence such that the at least one semiconductor body having the at least side face curved in the concave fashion is created.

5. The method according to claim 1, which comprises forming the at least one semiconductor body to transmit and receive light.

6. The method according to claim 5, which comprises forming a window layer permeable to a transmitted and received light on the sequence layer before carrying out the dry etching step.

7. The method according to claim 1, which comprises forming the semiconductor wafer substantially from GaAs.

8. The method according to claim 1, which comprises forming the layer sequence with at least one semiconductor layer containing InGaAlP.

9. The method according to claim 8, which comprises forming the layer sequence by applying an n-conductive first InGaAlP boundary layer, then applying an n-conductive active InGaAlP layer to the n-conductive first InGaAlP boundry layer, and subsequently applying an n-conductive second InGaAlP boundary layer to the n-conductive active InGaAlP layer.

10. The method according to claim 8, which comprises using an etching gas mixture selected from the group consisting of $Cl_2$ and $BCl_3$, and $Cl_2$ and $SiCl_4$ during the dry etching step.

11. The method according to claim 10, which comprises varying a concentration of the $Cl_2$ in the etching gas mixture for increasing the ratio of the vertical etching rate to the horizontal etching rate during the dry etching step.

12. The method according to claim 6, which comprises forming the window layer substantially from a material selected from the group consisting of GaP and AlGaAs.

13. The method according to claim 1, which comprises creating a roughened surface on the at least one side face during the dry etching step.

14. The method according to claim 1, which comprises disposing the at least one mesa trench as a plurality of mesa trenches such that the at least one semiconductor body has a mesa edge on all of its side faces.

15. The method according to claim 1, which comprises forming the at least one active zone of the at least one semiconductor body to transmit and receive light.

* * * * *